(12) United States Patent
Wu et al.

(10) Patent No.: US 11,758,724 B2
(45) Date of Patent: Sep. 12, 2023

(54) MEMORY DEVICE WITH MEMORY STRING COMPRISING SEGMENTED MEMORY PORTIONS AND METHOD FOR FABRICATING THE SAME

(71) Applicant: MACRONIX INTERNATIONAL CO., LTD., Hsinchu (TW)

(72) Inventors: Guan-Wei Wu, Zhubei (TW); Yao-Wen Chang, Zhubei (TW); I-Chen Yang, Miaoli County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 284 days.

(21) Appl. No.: 17/167,221

(22) Filed: Feb. 4, 2021

(65) Prior Publication Data

US 2022/0246637 A1 Aug. 4, 2022

(51) Int. Cl.
*H10B 43/27* (2023.01)
*H10B 41/10* (2023.01)
*H10B 41/27* (2023.01)
*H10B 43/10* (2023.01)

(52) U.S. Cl.
CPC .............. *H10B 43/27* (2023.02); *H10B 41/10* (2023.02); *H10B 41/27* (2023.02); *H10B 43/10* (2023.02)

(58) Field of Classification Search
CPC ........ H10B 43/27; H10B 41/10; H10B 41/27; H10B 43/10; H10B 43/35; H01L 29/40117
See application file for complete search history.

(56) References Cited

U.S. PATENT DOCUMENTS

| 9,406,693 | B1* | 8/2016 | Pang | H01L 29/66833 |
|---|---|---|---|---|
| 2012/0003828 | A1* | 1/2012 | Chang | H01L 29/792 438/585 |
| 2012/0058629 | A1* | 3/2012 | You | H01L 21/02104 438/479 |
| 2013/0270714 | A1* | 10/2013 | Lee | H01L 21/76879 257/774 |
| 2014/0159137 | A1* | 6/2014 | Yun | H10B 43/35 257/324 |
| 2014/0162440 | A1* | 6/2014 | Kim | H01L 29/7926 438/478 |
| 2015/0311214 | A1* | 10/2015 | Yoo | H10B 43/27 257/326 |
| 2016/0307915 | A1* | 10/2016 | Pang | H01L 29/40117 |
| 2016/0379989 | A1* | 12/2016 | Sharangpani | H01L 21/31155 438/269 |
| 2018/0012902 | A1* | 1/2018 | Choi | H10B 43/27 |
| 2019/0296033 | A1* | 9/2019 | Kinoshita | H10B 41/10 |

(Continued)

*Primary Examiner* — Jami Valentine Miller
*Assistant Examiner* — Pratiksha Jayant Lohakare
(74) *Attorney, Agent, or Firm* — McClure, Qualey & Rodack, LLP

(57) ABSTRACT

A memory device includes a substrate, a laminated structure and a memory string. The laminated structure is disposed on the substrate. The laminated structure includes a plurality of insulating layers and a plurality of conductive layers alternately stacked along a first direction. The memory string is accommodated in the laminated structure along the first direction. The memory string includes a memory layer and a channel layer, and the memory layer is disposed between the laminated structure and the channel layer. At least a portion of the memory layer and the insulating layers are overlapped along the first direction.

10 Claims, 9 Drawing Sheets

(56) References Cited

U.S. PATENT DOCUMENTS

| | | | |
|---|---|---|---|
| 2020/0185403 A1* | 6/2020 | Nyui | H01L 29/7827 |
| 2020/0242203 A1 | 7/2020 | Tanaka et al. | |
| 2020/0295025 A1* | 9/2020 | Lu | H10B 43/35 |
| 2021/0408034 A1* | 12/2021 | Lee | H10B 41/27 |
| 2022/0157828 A1* | 5/2022 | Zhang | H01L 29/66742 |

* cited by examiner

MEMORY DEVICE WITH MEMORY STRING COMPRISING SEGMENTED MEMORY PORTIONS AND METHOD FOR FABRICATING THE SAME

BACKGROUND OF THE INVENTION

Field of the Invention

The invention relates in general to a semiconductor device and a method for fabricating the same, in particular to a memory device and a method for fabricating the same.

Description of the Related Art

Recently, as the demand for more excellent memory devices has gradually increased, various three-dimensional (3D) memory devices have been provided, such as 3D NAND memory devices. Such three-dimensional memory devices can achieve higher storage capacity, have good data storage reliability and operating speed.

A typical three-dimensional NAND memory device includes a laminated structure formed of a plurality of insulating layers and a plurality of conductive layers alternately stacked, and a plurality of memory layers and channel layers penetrating the laminated structure. The intersections of each of the conductive layers and the memory layer define a plurality of memory cells, and the memory cells are connected by the channel layer to form a plurality of memory string.

Generally speaking, carriers (electrons or holes) can be stored in the memory layer for programming or erasing operations. However, when the environment changes (for example, electric field, high temperature, etc.), the carriers located in the memory layer may move, making the memory device unable to maintain good electrical characteristics.

Therefore, there is a need to propose an improved memory device and a method for fabricating the memory device to solve the problems faced by the prior art.

SUMMARY OF THE INVENTION

A memory device includes a substrate, a laminated structure and a memory string. The laminated structure is disposed on the substrate. The laminated structure includes a plurality of insulating layers and a plurality of conductive layers alternately stacked along a first direction. The memory string is accommodated in the laminated structure along the first direction. The memory string includes a memory layer and a channel layer, and the memory layer is disposed between the laminated structure and the channel layer. At least a portion of the memory layer and the insulating layers are overlapped along the first direction.

According to another embodiment of the present invention, a method for fabricating a memory device is provided. The method includes the following steps. Firstly, a substrate is provided. An initial stack is provided on the substrate, and the initial stack includes a plurality of first sacrificial layers and a plurality of second sacrificial layers alternately stacked along a first direction. Secondly, a memory string is formed. The memory string penetrates the initial stack along the first direction. The memory string includes a memory layer and a channel layer, and the memory layer is disposed between the initial stack and the channel layer. Next, a trench is formed, and the trench penetrates the initial stack along the first direction. The second sacrificial layers are removed through the trench. A plurality of conductive layers are formed where the second sacrificial layers are removed. After exposing the trench, the first sacrificial layers and portions of the memory layer are removed through the trench. After that, a plurality of insulating layers are formed at the positions where the first sacrificial layers and the portions of the memory layer are removed, so as to form a laminated structure in which insulating layers and conductive layers are alternately stacked. At least a portion of the memory layer and the insulating layers are overlapped along the first direction.

The above and other aspects of the invention will become better understood with regard to the following detailed description of the preferred but non-limiting embodiment(s). The following description is made with reference to the accompanying drawings.

DETAILED DESCRIPTION OF THE INVENTION

In the following detailed description, for ease of explanation, various specific details are provided to understand the embodiments of the present disclosure as a whole. However, it should be understood that one or more embodiments can be implemented without employing these specific details. In other cases, in order to simplify the drawings, the known structures and components are shown in schematic diagrams.

The memory device and a method for fabricating the same will be described below. For ease of explanation, the following embodiments will particularly take gate-all-around memory (GAA memory) as an example. However, the present invention is not limited to this. For example, the memory device and a method for fabricating the same of the present invention can be applied to memory devices having nitrogen-based memory materials, such as any three-dimensional NAND memory devices. The three-dimensional NAND memory device may include a gate-all-around memory device, a vertical gate memory device, or other suitable memory device.

FIGS. 1-7 are schematic diagrams illustrating the manufacturing process of the memory device 10 according to an embodiment of the present invention. FIGS. 8A and 8B show top views of the memory device 10 corresponding to the A-A' connecting line and the B-B' connecting line in FIG. 7, respectively. FIGS. 1-7 show the plane formed by the first direction (for example, the Z direction) and the second direction (for example, the X direction). FIGS. 8A and 8B illustrate the plane formed by the first direction (for example, the Z direction) and the third direction (for example, the Y direction). The first direction, the second direction and the third direction are intersected with each other. For example, the first direction, the second direction and the third direction are perpendicular to each other, but the present invention is not limited thereto.

Figure 1:
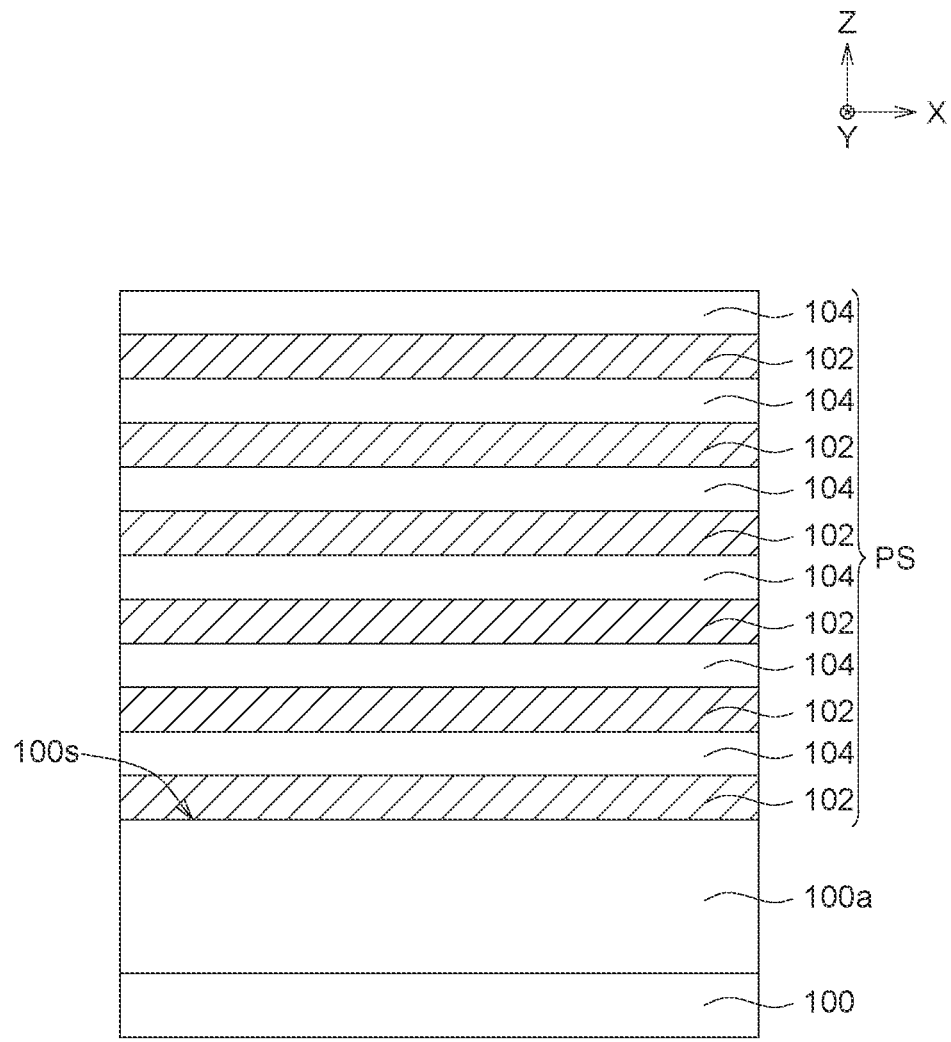
FIGS. 1-7 are schematic diagrams showing the manufacturing process of a memory device according to an embodiment of the present invention.

Referring to FIG. 1, a substrate 100 is provided. The substrate 100 may have an upper surface 100s. A well 100a can be formed in the substrate 100 by a doping process, and the well 100a extends downward from the upper surface 100s of the substrate 100. The well 100a may be N-type heavily doped or P-type lightly doped. Thereafter, an initial stack PS is provided on the upper surface 100s of the substrate 100. The initial stack PS includes a plurality of first sacrificial layers 102 and a plurality of second sacrificial layers 104 alternately stacked along a first direction (for example, the Z direction). The first sacrificial layer 102 and the second sacrificial layer 104 are respectively formed by a deposition process, for example. FIG. 1 only exemplarily shows an example of 6 layers of the first sacrificial layers 102 and 6 layers of the second sacrificial layers 104, but the present invention is not limited thereto. The initial stack PS may include more than 6 layers of the first sacrificial layers 102 and more than 6 layers of the second sacrificial layers 104.

In some embodiments, the material of the substrate 100 may include silicon; the material of the first sacrificial layers 102 may include oxide, such as silicon dioxide; the material of the second sacrificial layers 104 may include nitride, such as silicon nitride.

Figure 2:
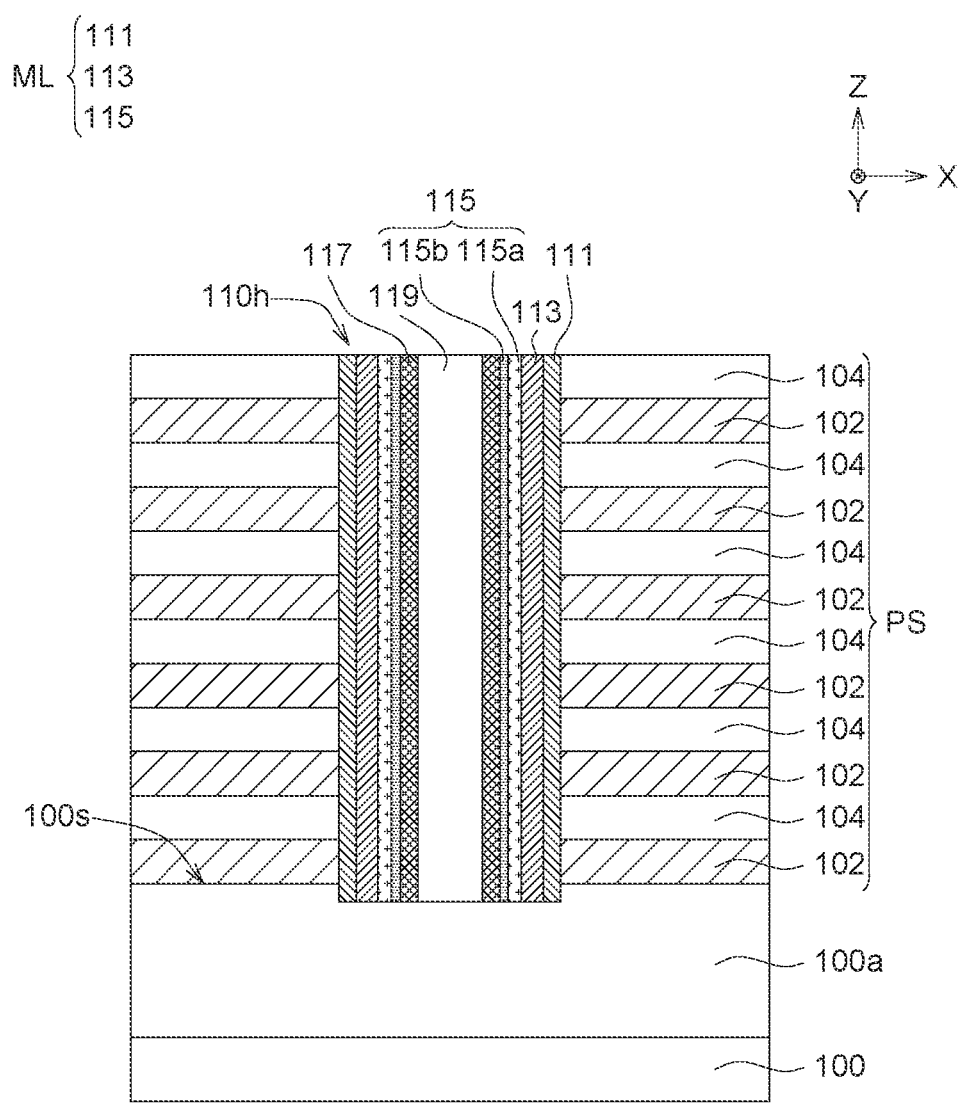

Referring to FIG. 2, after an etching process is used to form a through opening 110h that penetrates the initial stack PS along a first direction and exposes the substrate 100, a memory string MS is formed in the through opening 110h. In some embodiments, the through opening 110h may penetrate a portion of the substrate 100. The memory string MS includes a memory layer ML, a channel layer 117 and an insulating pillar 119. The memory layer ML is disposed between the initial stack PS and the channel layer 117, and the memory layer ML surrounds the channel layer 117. A portion of the channel layer 117 is disposed between the memory layer ML and the insulating pillar 119. The memory layer ML includes a blocking layer 111, a trapping layer 113, and a tunneling layer 115. The tunneling layer 115 is adjacent to the channel layer 117, and the trapping layer 113 is disposed between the blocking layer 111 and the tunneling layer 115. The tunneling layer 115 may be a multi-layer structure. In this embodiment, the tunneling layer 115 includes a first tunneling structure 115a and a second tunneling structure 115b. However, the present invention is not limited thereto. The tunneling layer 115 may be a 3-layer structure or other suitable multilayer structure.

In detail, the forming steps of the memory string MS may include sequentially forming a blocking layer 111, a trapping layer 113, a first tunneling structure 115a, a second tunneling structure 115b, a channel layer 117 and an insulating pillar 119 disposed on the sidewall of the through opening 110h by a deposition process. In some embodiments, the material of the blocking layer 111 may include oxide; the material of the trapping layer 113 may include nitride; the material of the first tunneling structure 115a may include oxide; the material of the second tunneling structure 115b may include oxynitride, such as silicon oxynitride; the material of the channel layer 117 may include polysilicon; the material of the insulating pillar 119 may include oxide; however, the present invention is not limited thereto.

Figure 3:
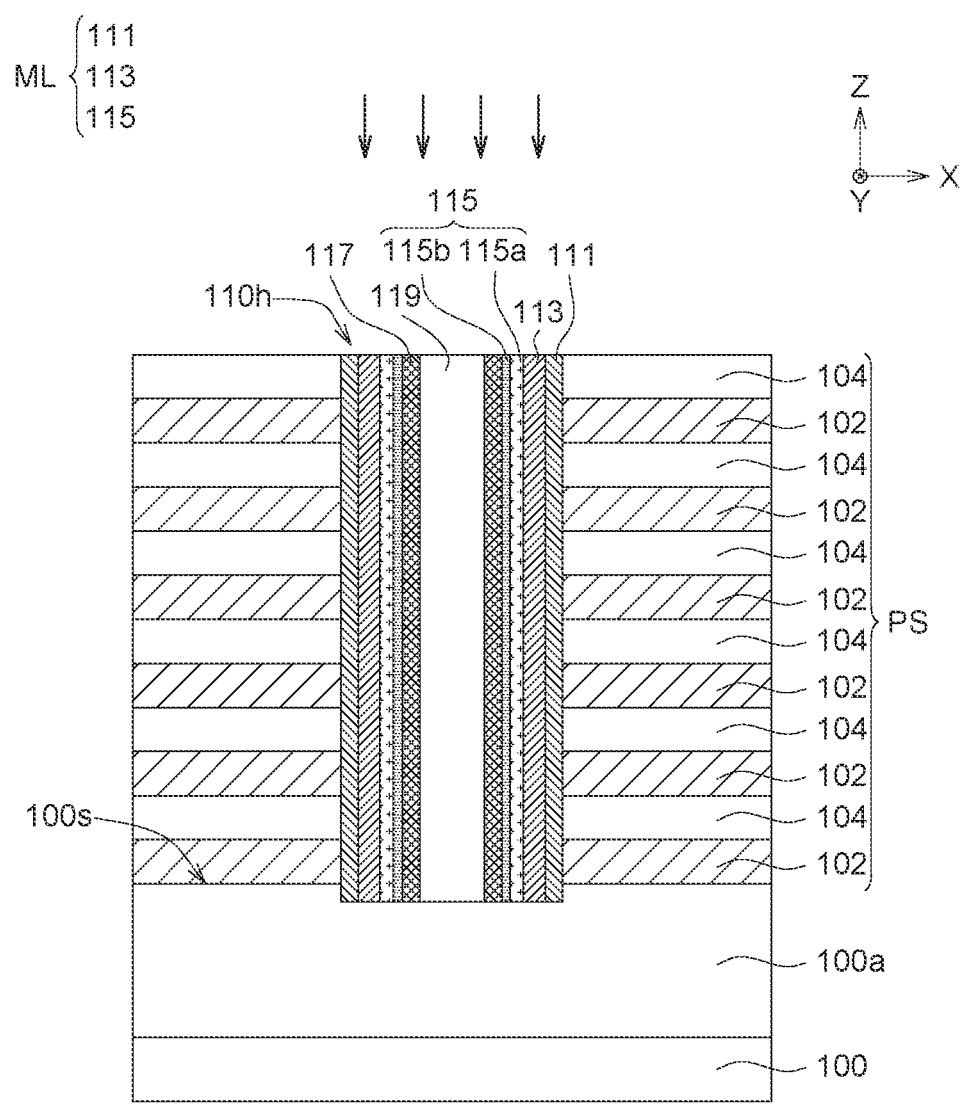

Referring to FIG. 3, a doping process is performed on the channel layer 117. For example, the top of the channel layer 117 may be doped with arsenic to be electrically connected to the bit line (not shown).

Figure 4:
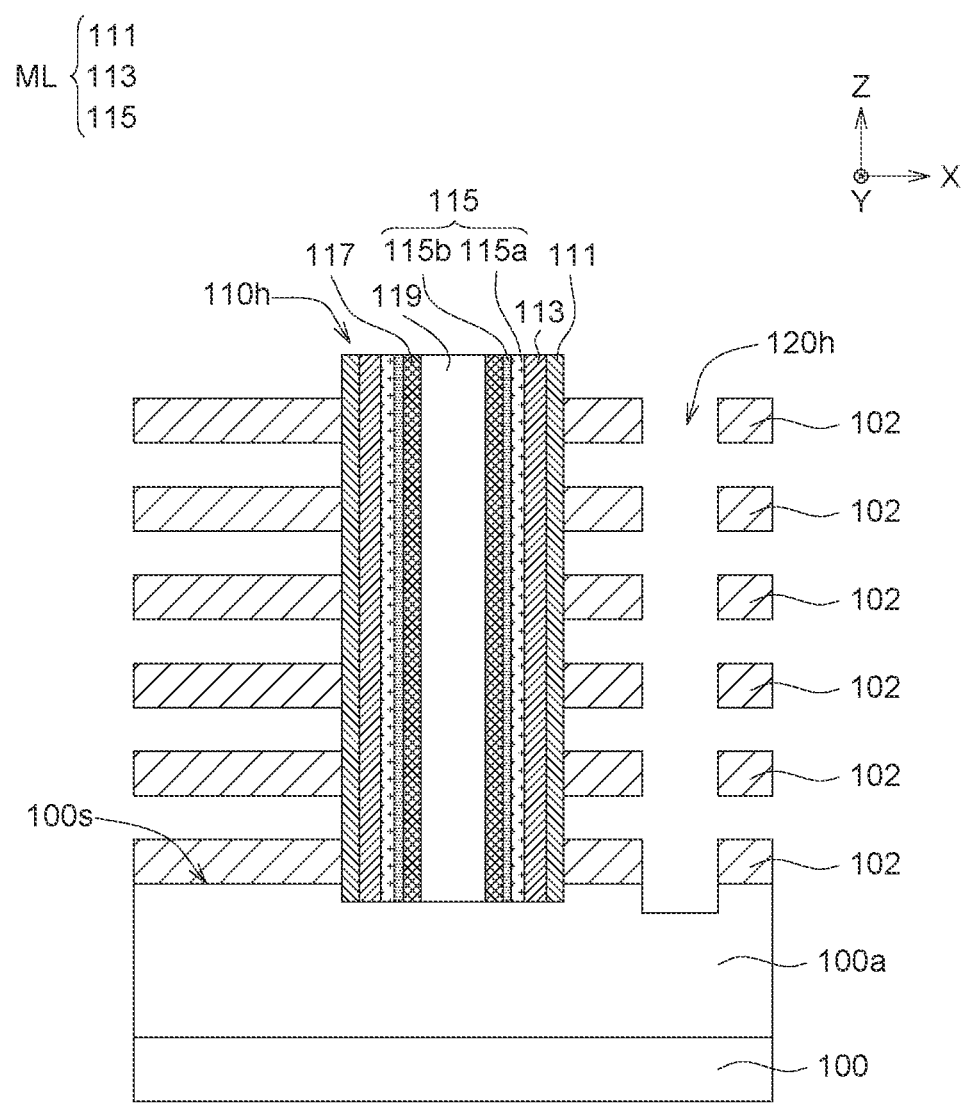

Referring to FIG. 4, a trench 120h is formed by an etching process, and the trench 120h penetrates the initial insertion PS along the first direction. After that, the second sacrificial layer 104 is removed through the trench 120h. In some embodiments, the trench 120h may penetrate a portion of the substrate 100. The second sacrificial layer 104 can be removed by a selective etching process.

Figure 5:
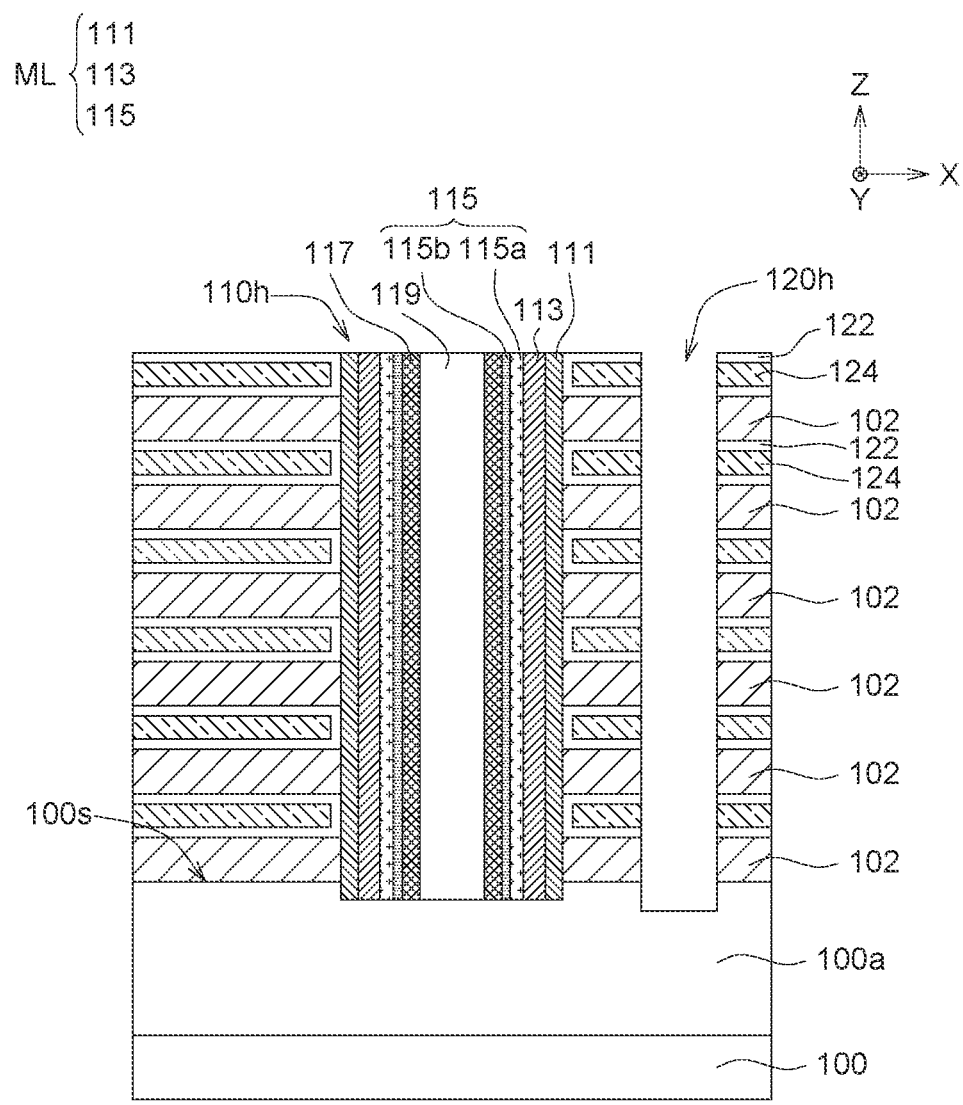

Referring to FIG. 5, a plurality of dielectric layers 122 and a plurality of conductive layers 124 are formed on the positions where the second sacrificial layers 104 are removed, and the dielectric layers 122 respectively surround the conductive layers 124. In some embodiments, the material of the dielectric layers 122 may include a material with a high dielectric constant, such as aluminum oxide ($Al_2O_3$). The material of the conductive layer 124 may include a conductive material, for example, titanium nitride (TiN). The conductive layer 124 may serve as a word line.

Figure 6:
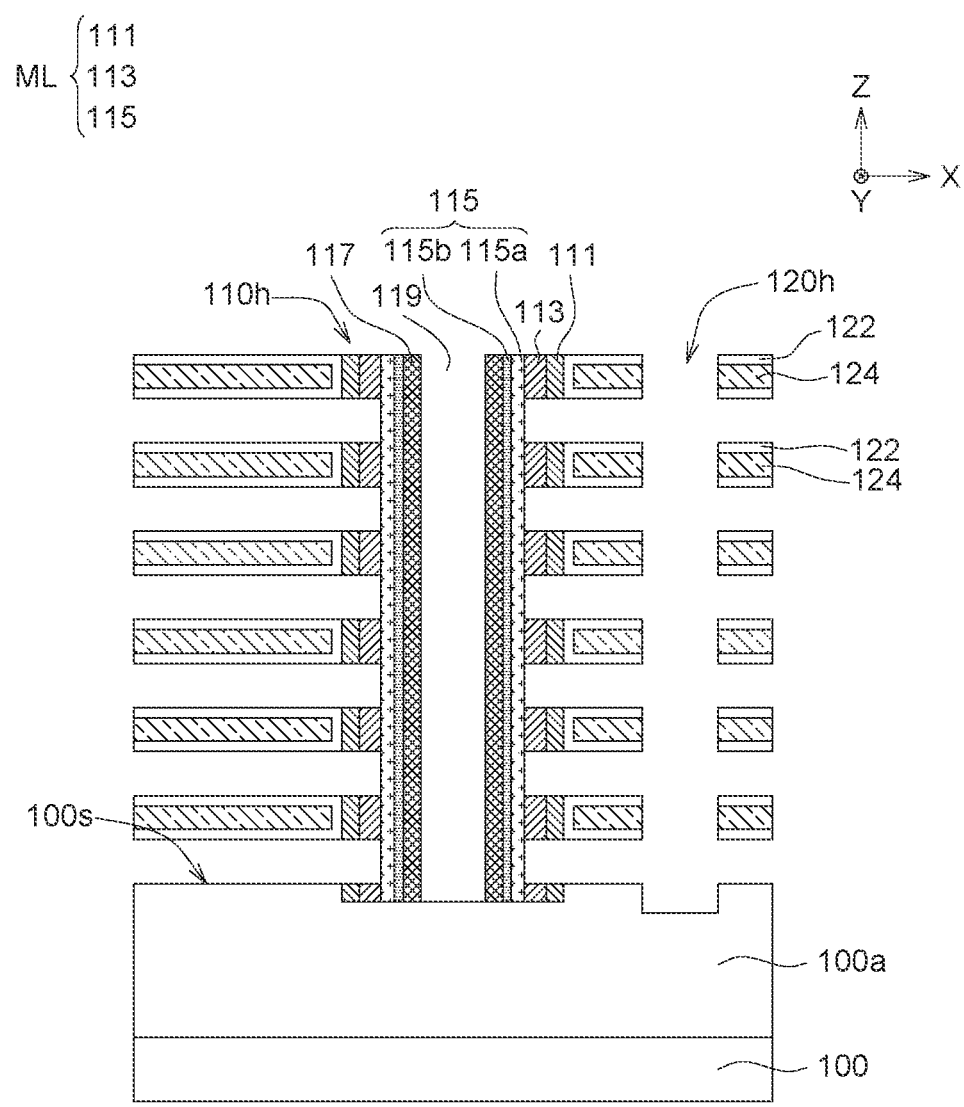

Referring to FIG. 6, after the trench 120h is exposed, the first sacrificial layers 102 and portions of the memory layer ML are removed through the trench 120h. The first sacrificial layers 102 are removed by, for example, a selective etching process. Each of the portions of the memory layer ML which are removed includes, for example, a portion of the blocking layer 111 and a portion of the trapping layer 113. The blocking layer 111 and the trapping layer 113 are removed by different anisotropic etching processes, for example.

Figure 7:
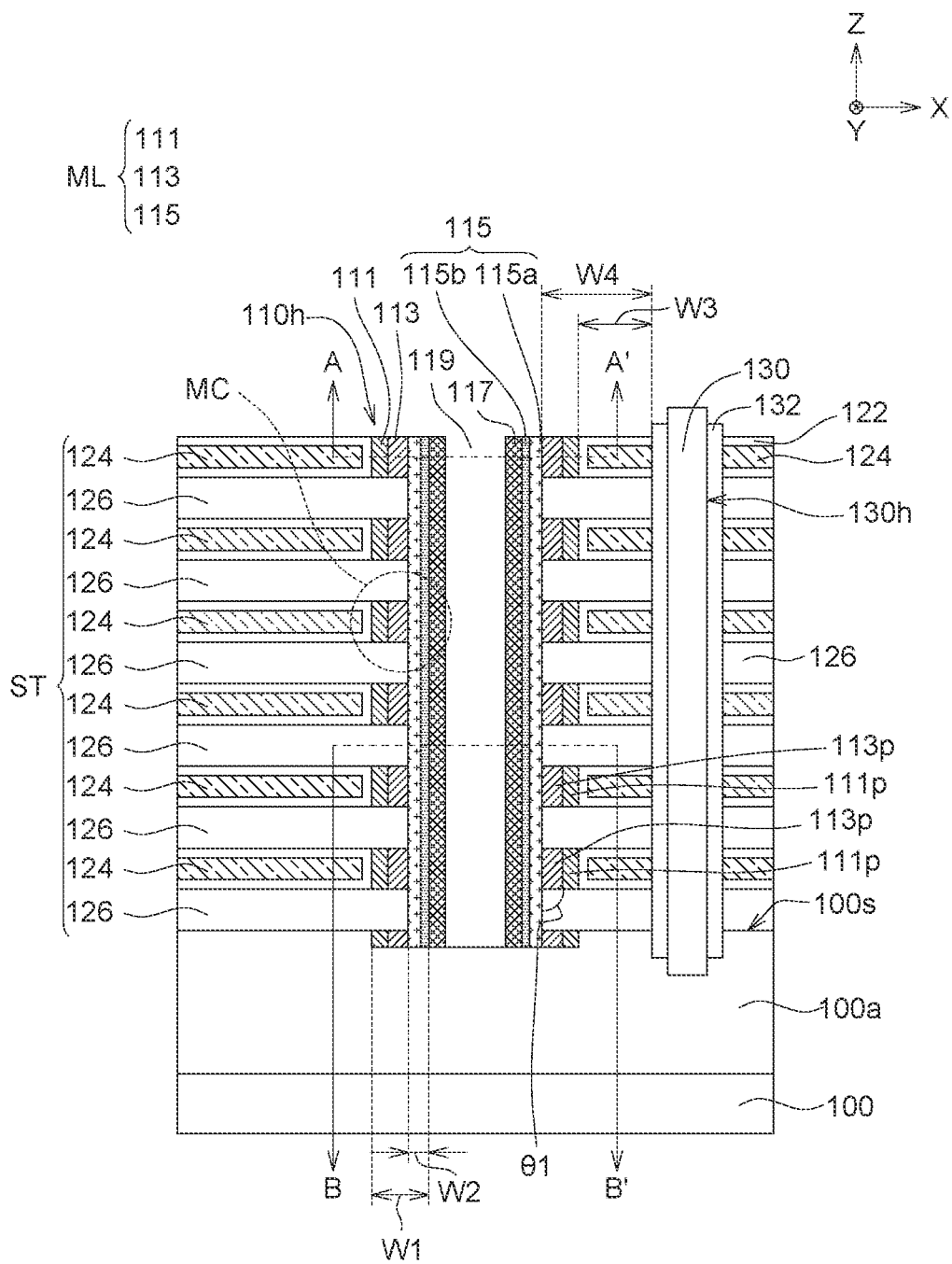
Figure 8A:
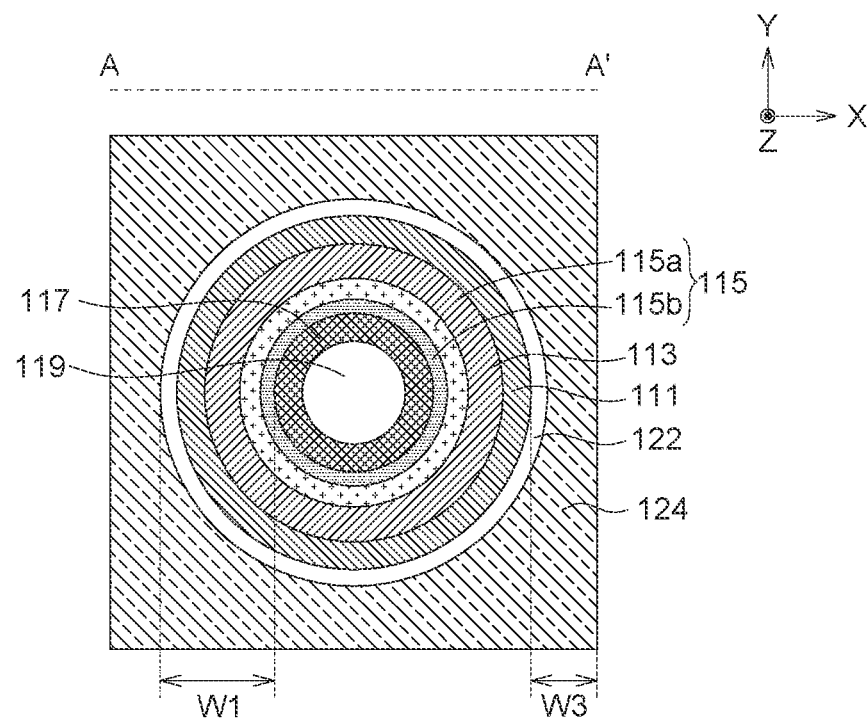
FIGS. 8A and 8B are top views of the memory device corresponding to the A-A' connecting line and B-B' connecting line in FIG. 7, respectively.
Figure 8B:
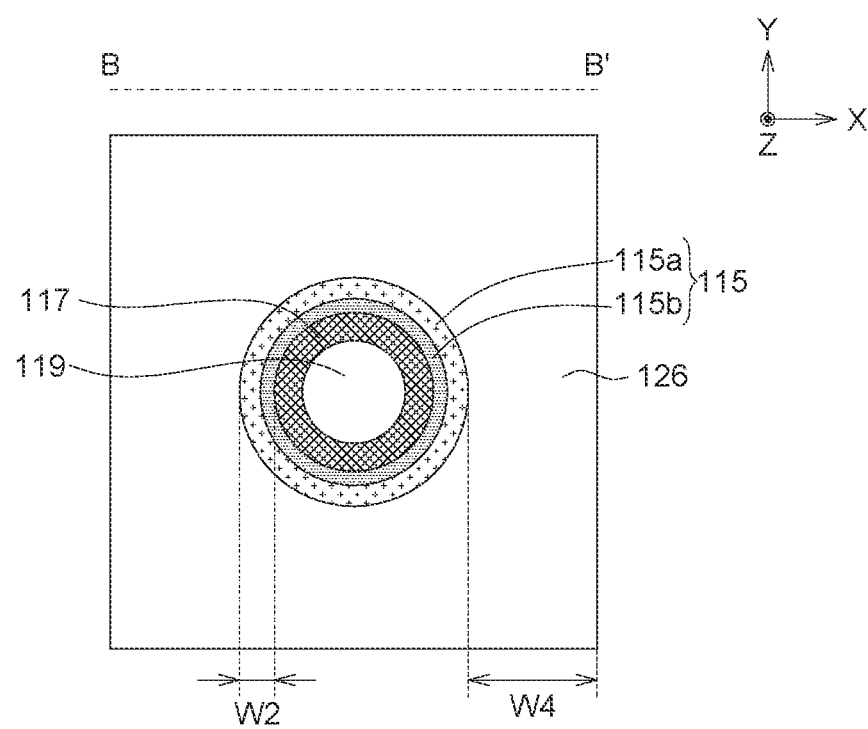

Referring to FIG. 7, a plurality of insulating layers 126 are formed where the first sacrificial layers 102 and the portions of the memory layer ML are removed to form a laminated structure ST in which the insulating layers 126 and the conductive layers 124 are alternately stacked. In some embodiments, the material of the insulating layers 126 includes oxide. Then, the material in the trench 120h is removed by an etching back process, and the trench 120h and the substrate 100 are exposed again. Thereafter, a conductive pillar 130 and an isolation layer 132 are formed in the trench 120h. The conductive pillar 130 and the isolation layer 132 penetrate the laminated structure ST along the first direction. The conductive pillar 130 is electrically connected to the substrate 100. The isolation layer 132 is disposed between the conductive layers 124 and the conductive pillar 130 to electrically isolate the conductive layers 124 and the conductive pillar 130 from each other, so that the memory device 10 is formed. FIG. 7 only illustrates 6 layers of conductive layers 124 and 6 layers of insulating layers 126, but the present invention is not limited thereto. The laminated structure ST may include more than 6 layers of conductive layers 124 and more than 6 layers of insulating layers 126.

In detail, the steps of forming the conductive pillar 130 and the isolation layer 132 in the trench 120h may include the following steps. First, an oxide (for example, silicon dioxide) is filled in the trench 120h to form an isolation layer 132. Then, a portion of the oxide is removed to form a contact opening 130h and the substrate 100 is exposed. Thereafter, a conductive material is filled in the contact opening 130h to form a conductive pillar 130. If the well 100a includes P-type dopants, before forming the conductive pillar 130, a doping process (for example, arsenic dopant) is performed on the substrate 100 through the contact opening 130h, so that the substrate 100 is electrically connected to the common source line. If the well 100a includes N-type dopants, there is no need to perform a doping process on the substrate 100.

Referring to FIGS. 7, 8A, and 8B at the same time. The memory layer ML has a plurality of first portions corresponding to the conductive layers 124 and a plurality of second portions corresponding to the insulating layers 126. A width W1 of the first portions of the memory layer ML formed along the second direction is greater than a width W2 of the second portions of the memory layer ML formed along the second direction. A width W3 of each of the dielectric layers 122 and each of the conductive layers 124 along the second direction is smaller than a width W4 of each of the insulating layers 126 along the second direction.

As shown in FIG. 7, in the present embodiment, an angle θ1 of the insulating layers 126 adjacent to the first tunneling structure 115a is 90 degrees, but the present invention is not limited thereto. The angle θ1 can be between 90 degrees and 120 degrees.

Figure 9A:
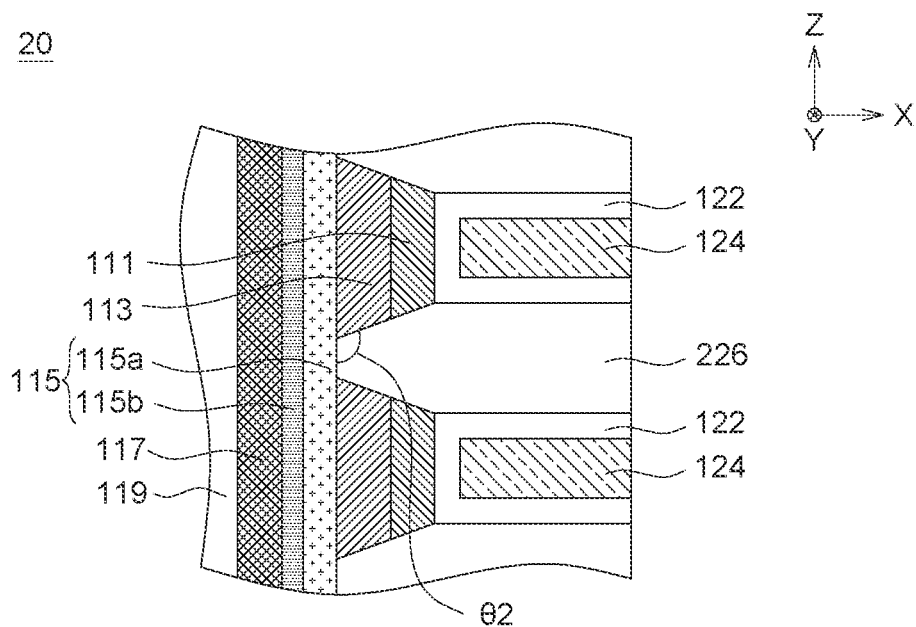
FIG. 9A illustrates an angle of the insulating layer according to an embodiment of the present invention.
Figure 9B:
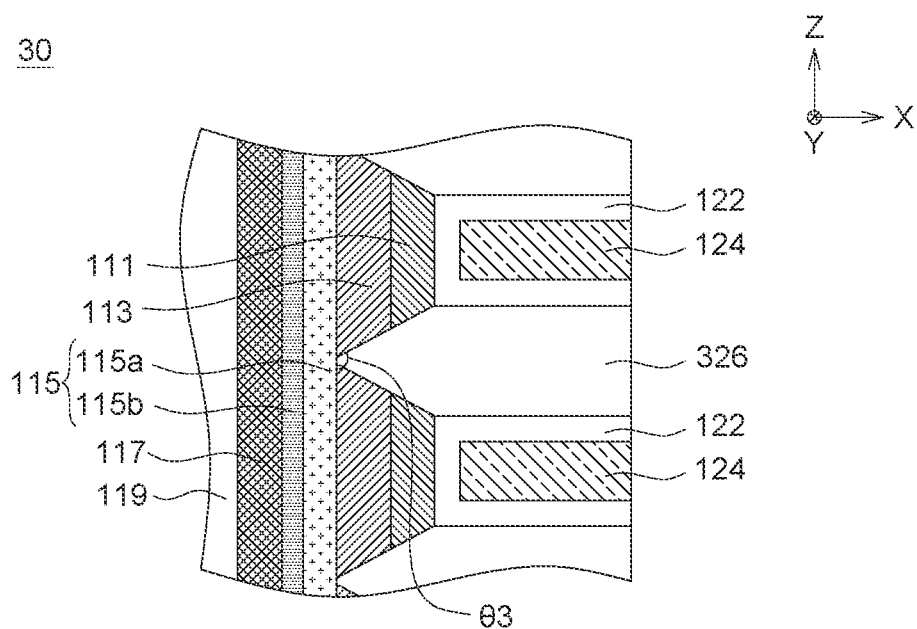
FIG. 9B illustrates an angle of the insulating layer according to another embodiment of the present invention.

FIG. 9A is a partial schematic diagram of a memory device 20 according to another embodiment of the present invention. FIG. 9B is a partial schematic diagram of a memory device 30 according to further embodiment of the present invention. The memory devices 20 and 30 are similar to the memory device 10, and the difference therebetween is in the angle of the insulating layers 226 and 326 adjacent to the first tunneling structure 115a.

As shown in FIG. 9A, in the memory device 20, an angle θ2 of the insulating layer 226 adjacent to the first tunneling structure 115a may be 110 degrees. As shown in FIG. 9B, in the memory device 30, an angle θ3 of the insulating layer 326 adjacent to the first tunneling structure 115a may be 120 degrees.

According to an embodiment of the present invention, a memory device 10 (as shown in FIG. 7) and a method for fabricating the same (as shown in FIGS. 1-7) are provided. The memory device 10 includes a substrate 100, a laminated structure ST, a memory string MS, a conductive pillar 130, and an isolation layer 132. The laminated structure ST is disposed on the substrate 100. The laminated structure ST includes a plurality of insulating layers 126 and a plurality of conductive layers 124 alternately stacked along a first direction (for example, the Z direction), and further includes a plurality of dielectric layers 122, The dielectric layer 122 surrounds the conductive layer 124 respectively. Each of the insulating layers 126 and each of the conductive layers 124 extend along a second direction (for example, the X direction), and the first direction is intersected with the second direction. For example, the first direction is perpendicular to the second direction, but the present invention is not limited thereto. The substrate includes a well 100a, and the well 100a extends downward from an upper surface 100s of the substrate 100. The well 100a may be an N-type heavily doped well or a P-type lightly doped well. In addition, the memory string MS includes a plurality of memory cells MC, and each of the memory cells MC is formed at a plurality of intersections of each of the conductive layers 124 and the memory layer ML, and the memory cells MC are connected in series with each other through the channel layer 117. The conductive pillar 130 and the isolation layer 132 penetrate the laminated structure ST along the first direction, the conductive pillar 130 is electrically connected to the substrate 100, and the isolation layer 132 is disposed between the conductive layers 124 and the conductive pillar 130. In some embodiments, the material of the isolation layer 132 may include oxide (for example, silicon dioxide), and the material of the conductive pillar 130 may include a conductive material (for example, titanium nitride). The material of the isolation layer 132 may be the same as the material of the insulating layers 126, and the material of the conductive pillar 130 may be the same as the material of the conductive layers 124, but the present invention is not limited thereto.

The memory strings MS penetrate the laminated structure ST along the first direction. That is, the memory strings MS is accommodated in the laminated structure ST along the first direction. The memory string MS includes a memory layer ML, a channel layer 117 and an insulating pillar 119, and the memory layer ML is disposed between the laminated structure ST and the channel layer 117. At least a portion of the memory layer ML and each of the insulating layers 126 are overlapped with each other along the first direction.

According to the present embodiment, the memory layer ML includes a blocking layer 111, a trapping layer 113, and a tunneling layer 115. The tunneling layer 115 is adjacent to the channel layer 117, and the trapping layer 113 is disposed between the blocking layer 111 and the tunneling layer 115. The trapping layer 113 and the blocking layer 111 are overlapped with each of the insulating layers 126 along the first direction. The blocking layer 111 includes a plurality of blocking portions 111p, and the trapping layer 113 includes a plurality of trapping portions 113p. The blocking portions 111p and the trapping portions 113p correspond to the conductive layers 124 (that is, the blocking portions 111p, the trapping portions 113p and the conductive layers 124 are overlapped along the second direction), and the trapping portions 113p are separated from each other by the insulating layers 126, that is, the trapping layer 113 does not extend continuously along the first direction, but has a segmented structure. The insulating layers 126 directly contact the tunneling layer 115. The tunneling layer 115 is a multilayer structure. In the present embodiment, the tunneling layer 115 includes a first tunneling structure 115a and a second tunneling structure 115b. The first tunneling structure 115a surrounds the second tunneling structure 115b. The present invention is not limited thereto, and the tunneling layer 115 may include 3 layers or other suitable number of layers. The insulating layers 126 directly contact the first tunneling structure 115a. In some embodiments, the material of the blocking layer 111 includes oxide, the material of the trapping layer 113 includes nitride, and the material of the tunneling layer 115 includes oxide. For example, the material of the first tunneling structure 115a is oxide; the material of the second tunneling layer 115a is oxide; the material of the tunneling structure 115b includes silicon oxynitride.

Compared with the comparative example in which the trapping layer continuously extends along the first direction, since the trapping layer 113 of the present application has a segmented structure, a plurality of trapping portions 113p of the trapping layer 113 corresponding to different conductive layers 124 are separated from each other by the insulating layers 126. Accordingly, when the specific memory cell MC is programmed or erased, the carriers (such as electrons or holes) stored in the trapping layer 113 of the specific memory cell MC may be blocked by the insulating layers 126, even if the environment changes (such as electric field, high temperature, etc.), the carriers are still not easy to move, so the carriers can be completely retained in the trapping layer 113 (that is, the trapping portions 113p) of the specific memory cell MC, the memory cell MC does not generate electron loss during the programming operation, the threshold voltage is not decreased; the memory cell MC does not generate hole loss during the erase operation, and the threshold voltage is not increased. Obviously, either the programmed memory cell MC or the erased memory cell MC of the present application can avoid the problem of the threshold voltage fluctuation and can perform good operation, so the memory device 10 of the present application can maintain better electrical characteristics.

While the invention has been described by way of example and in terms of the preferred embodiment(s), it is to be understood that the invention is not limited thereto. On the contrary it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a substrate having an upper surface;
   a laminated structure disposed on the substrate, the laminated structure comprising a plurality of insulating layers and a plurality of conductive layers alternately stacked along a first direction vertical to the upper surface; and
   a memory string accommodated in the laminated structure along the first direction, the memory string comprising a memory layer and a channel layer, and the memory layer is disposed between the laminated structure and the channel layer,
   wherein at least a portion of the memory layer and the insulating layers are overlapped along the first direction, the at least a portion of the memory layer comprises a plurality of memory portions, each of the memory portions corresponds to one layer of the conductive layers, and each of the memory portions completely surrounds the channel layer.

2. The memory device according to claim 1, wherein the memory layer comprises a blocking layer, a trapping layer, and a tunneling layer, and the tunneling layer is adjacent to the channel layer, and the trapping layer is disposed between the blocking layer and the tunneling layer,
   wherein the trapping layer and the blocking layer overlap the insulating layers along the first direction.

3. The memory device according to claim 2, wherein the blocking layer comprises a plurality of blocking portions, the trapping layer comprises a plurality of trapping portions, the blocking portions and the trapping portions corresponding to the conductive layers, and the trapping portions are separated from each other by the insulating layers.

4. The memory device according to claim 2, wherein the insulating layers directly contact the tunneling layer.

5. The memory device according to claim 2, wherein the tunneling layer has a multilayer structure.

6. The memory device according to claim 2, wherein a material of the blocking layer comprises oxide, a material of the trapping layer comprises nitride, and a material of the tunneling layer comprises oxide.

7. The memory device according to claim 1, wherein the insulating layers and the conductive layers extend along a second direction, and the first direction is intersected with the second direction;
   wherein the memory layer has a plurality of first portions corresponding to the conductive layers and a plurality of second portions corresponding to the insulating layers, and a width of the first portions of the memory layer formed along the second direction is greater than a width of the second portions of the memory layer formed along the second direction.

8. The memory device according to claim 1, wherein the laminated structure further comprises a plurality of dielectric layers, and the dielectric layers respectively surround the conductive layers,
   wherein the insulating layers and the conductive layers extend along a second direction, and the first direction is intersected with the second direction;
   a width of the dielectric layers and the conductive layers formed along the second direction is smaller than a width of the insulating layers formed along the second direction.

9. The memory device according to claim 1, wherein the substrate comprises a well, and the well extends downward from the upper surface of the substrate,
   where the memory string comprises a plurality of memory cells, the memory cells are formed at a plurality of intersections of the conductive layers and the memory layer, and memory cells are connected in series with each other through the channel layer.

10. The memory device according to claim 1, further comprising a conductive pillar and an isolation layer, and the conductive pillar and the isolation layer penetrate the laminated structure along the first direction, the conductive pillar is electrically connected to the substrate, and the isolation layer is disposed between the conductive layers and the conductive pillar.

* * * * *